(12) United States Patent
Sun et al.

(10) Patent No.: US 6,674,633 B2
(45) Date of Patent: Jan. 6, 2004

(54) PROCESS FOR PRODUCING A STRONTIUM RUTHENIUM OXIDE PROTECTIVE LAYER ON A TOP ELECTRODE

(75) Inventors: Shan Sun, Colorado Springs, CO (US); George Hickert, Colorado Springs, CO (US); Katsuyoshi Matsuura, Kanagawa (JP); Takeyasu Saito, Kanagawa (JP); Soichiro Ozawa, Kanagawa (JP); Naoyuki Satoh, Kanagawa (JP); Mitsushi Fujiki, Kanagawa (JP); Satoru Mihara, Kanagawa (JP); Jeffrey S. Cross, Kanagawa (JP); Yoshimasa Horii, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/797,005

(22) Filed: Feb. 28, 2001

(65) Prior Publication Data
US 2002/0149040 A1 Oct. 17, 2002

(51) Int. Cl.[7] ................................................ H01G 4/06
(52) U.S. Cl. ...................................... 361/311; 257/296
(58) Field of Search ............................ 361/301.4, 301.3, 361/303–305, 306.1–306.3, 311–313, 320, 321.1, 321.5; 257/296, 301, 303, 310

(56) References Cited

U.S. PATENT DOCUMENTS

| | | | | |
|---|---|---|---|---|
| 5,838,035 A | * | 11/1998 | Ramesh | 257/295 |
| 5,990,507 A | * | 11/1999 | Mochizuki et al. | 257/295 |
| 6,115,281 A | * | 9/2000 | Aggarwal et al. | 365/145 |
| 6,146,963 A | * | 11/2000 | Yu | 438/396 |
| 6,172,385 B1 | * | 1/2001 | Duncombe et al. | 257/295 |
| 6,194,753 B1 | * | 2/2001 | Seon et al. | 257/295 |
| 6,265,230 B1 | * | 7/2001 | Aggarwal et al. | 438/3 |
| 6,351,006 B1 | * | 2/2002 | Yamakawa et al. | 257/295 |

FOREIGN PATENT DOCUMENTS

| | | |
|---|---|---|
| CN | 413807 | 1/2000 |
| JP | H10-12830 | 1/1998 |

* cited by examiner

Primary Examiner—Dean A. Reichard
Assistant Examiner—Eric Thomas
(74) Attorney, Agent, or Firm—Hogan & Hartson L.L.P.

(57) ABSTRACT

A method for the fabrication of a cap layer on a top electrode layer of a ferroelectric capacitor includes the steps of depositing an amorphous layer, usually made of $Sr_{(x)}Ru_{(y)}O_3$, on the top electrode and then annealing the amorphous layer in two stages in order convert the amorphous layer into the cap layer. The first anneal is performed at 500° C. to 700° C. in a non-oxidizing atmosphere, such as nitrogen, and converts the amorphous layer into a crystallized layer of $Sr_{(x)}Ru_{(y)}O_3$. The second anneal is performed at 300° C. to 500° C. in an oxidizing atmosphere, such as oxygen, and converts the crystallized layer into the cap layer. The method is applied to the formation of a ferroelectric capacitor element of an integrated semiconductor device.

8 Claims, 8 Drawing Sheets

PROCESS FOR PRODUCING A STRONTIUM RUTHENIUM OXIDE PROTECTIVE LAYER ON A TOP ELECTRODE

FIELD OF THE INVENTION

This invention relates to the field of ferroelectric memory integrated circuit processing. In particular, the invention relates to forming protective layers on top of top electrodes of ferroelectric capacitors in ferroelectric memory integrated circuits.

BACKGROUND OF THE INVENTION

The potential of ferroelectric random access memory (FRAM) as the preferred memory technology for handheld electronic devices like cellular telephones, personal digital assistants (PDAs), and digital cameras has long been recognized—FRAM is a nonvolatile memory technology that does not lose data when power is shut off. In contrast, the data stored in the volatile DRAM memory used in most desktop and notebook computers is lost when the computer is shut down. These computers require an additional component, such as a bulky and delicate hard disk drive, to retain data between power ups. Thus, FRAM helps keep handheld devices small and durable by eliminating the need for additional, nonvolatile data storage components.

FRAM has several advantages over other nonvolatile memory technologies such as electrically erasable, programmable read only memory (EEPROM) and flash EEPROM. EEPROM and flash EEPROM tend to have short read times, ranging between nanoseconds and microseconds, but write times on the order of milliseconds. The several orders of magnitude difference between read and write times, combined with the block-erase character of flash EEPROM, can complicate the design and use of EEPROM and flash EEPROM devices. In contrast, FRAM can execute both read and write operations in less than one microsecond.

FRAM also has excellent endurance characteristics: the useable lifetime of FRAM memory cells can extend to more than a trillion ($10^{12}$) read/write cycles. Such strong resistance to read/write cycle fatigue makes FRAM well suited for devices like portable computers that execute hundreds of millions to billions of operations per second.

FRAM memory cells are formed by capacitors such that data is accessed by manipulating the voltage and/or current applied to electrodes of the capacitors. The capacitors in FRAM memory cells use ferroelectric compounds to separate the electrodes. Ferroelectric compounds commonly used in FRAM include oxides with a perovskite crystal structure such as lead titanate zirconate-$Pb(Zr_xTi_{1-x})O_3$—commonly referred to as PZT, and strontium bismuth titanate-SrBiTiO—commonly referred to as SBT. These ferroelectric dielectric materials are integrated with other semiconductor devices to provide circuitry for addressing, selection, and control logic. Unfortunately, the desired electrical characteristics of many ferroelectric materials, such as data retention and resistance to fatigue, are degraded under typical semiconductor processing conditions. Thus, semiconductor device manufacturers face continual difficulty in preserving the high quality electrical characteristics of ferroelectric materials when integrating FRAM memory cells with standard semiconductor production and packaging processes.

One of the primary reasons for the degradation of FRAM during processing is believed to be the reaction of oxygen atoms in the ferroelectric material with gases such as hydrogen. Hydrogen exposure occurs during cleaning operations like plasma ashing to remove photoresists. Also, metal deposition processes often incorporate hydrogen through the use of organometallic compounds and/or the use of hydrogen to treat formed metal structures. Moreover, it is common in semiconductor-manufacturing processes to remove excess material after a deposition by chemical mechanical polishing (CMP). While CMP is effective for removing excess materials such as tungsten, the chemical reactions and mechanical agitation are also believed to drive hydrogen into the ferroelectric layer and damage the PZT. Consequently, the resulting FRAM produced has much poorer and inconsistent quality than desired.

SUMMARY OF THE INVENTION

The present invention is directed to an integrated circuit and methods for making an integrated circuit that include ferroelectric components integrated with other semiconductor devices that provide improved performance and greater process latitude. The present invention provides for forming a protective cap layer comprising conducting perovskite or layered perovskite material on the top electrode of a ferroelectric capacitor in order to protect the underlying layer (or layers) of ferroelectric materials from chemical degradation by hydrogen and other reduction gases.

In accordance with the present invention there is provided an integrated semiconductor device that comprises a ferroelectric capacitor, where a protective cap layer, comprising strontium-ruthenium-oxide (SRO), is deposited over the top electrode of the capacitor. The SRO cap layer protects the ferroelectric dielectric layer of the capacitor from chemical and mechanical degradation during semiconductor fabrication processes. In particular, the cap layer is thought to hinder the migration of hydrogen through the top electrode and into the ferroelectric dielectric layer, where it degrades the ferroelectric dielectric materials such as PZT.

Further in accordance with the present invention, there is also provided a method for forming the SRO cap layer on the top electrode of a ferroelectric capacitor. In this method, the SRO cap layer is annealed twice after being deposited on the top electrode: First, the cap layer, originally deposited in an amorphous phase, is annealed in a non-oxidizing atmosphere at a temperature of 500° C. to 700° C. in order to crystallize the SRO. Then, the crystallized SRO cap layer is annealed again, only this time in an oxidizing atmosphere at a temperature of 300° C. to 500° C. The resulting crystallized, oxygen annealed SRO cap layer provides the underlying ferroelectric dielectric layer with excellent protection from hydrogen degradation during subsequent device fabrication steps.

The ferroelectric capacitor structure provided by the present invention is more robust in the face of subsequent temperature and chemical exposure during annealing, cleaning, multi-layer metal processing, interconnect processing and assembly. Moreover, the adverse impact of processes subsequent to fabrication of the capacitor structures is reduced, enabling a wider variety of processes to be performed subsequent to fabrication and thereby enabling new devices with higher levels of integration to be achieved without compromising the performance of the ferroelectric devices.

DETAILED DESCRIPTION OF THE INVENTION

Figure 1:
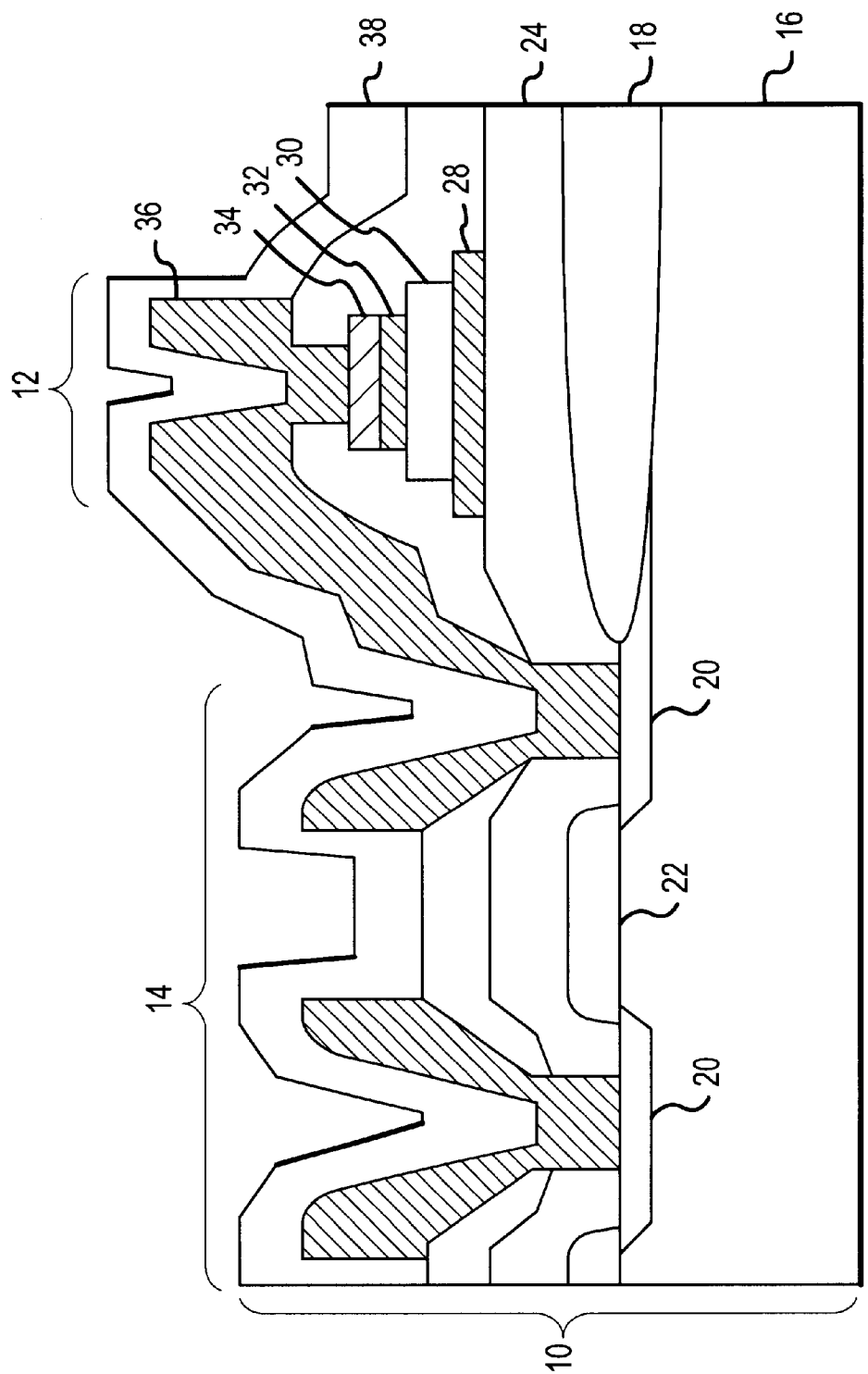
FIG. 1 is a cross section of a ferroelectric capacitor on a semiconductor circuit fabricated according to the present invention.

Referring now to FIG. 1, an example of an integrated ferroelectric memory cell 10 incorporated into an integrated semiconductor device of the present invention is shown. The integrated ferroelectric cell 10 includes a ferroelectric capacitor 12, as well as a field-effect transistor (FET) 14. In this particular implementation, the ferroelectric memory cell 10 is configured as a one transistor-one capacitor (1T-1 C) memory cell. The memory cell 10 includes a substrate such as a single crystal silicon substrate that may include a silicon epitaxial layer 16. A thick field oxide layer 18 defines and separates active areas. Diffused areas 20 form active device components such as drain and source regions of the transistor 14. A gate electrode 22 couples to or forms a portion of, a word line (extending orthogonal to the plane of FIG. 1 and therefore not shown). Planarization layer 24 comprises an insulating material such as an oxide that is applied in a thick layer and planarized using chemical, mechanical, chemical mechanical polishing, or the like to provide a flat working surface for overlying device structures.

In a preferred embodiment, an adhesion layer (not shown) lies between the ferroelectric capacitor 12 to the planarization layer 24, in order to enhance the adhesion of the ferroelectric capacitor 12 to the rest of the integrated semiconductor device. The adhesion layer (not shown due to its extreme thinness) is preferably made of titanium oxide with a thickness of 50 Å to 200 Å, although thinner and thicker layers are suitable when they demonstrate adhesion.

The capacitor 12 is formed with a bottom electrode 28, a ferroelectric dielectric layer 30, a top electrode layer 32, and the SRO cap layer 34, lying on top of the electrode layer 32. The bottom electrode layer 28 is preferably fabricated of platinum, and has a thickness of 500 Å to 2000 Å, more preferably 1000 Å, although thinner and thicker layers are suitable when they demonstrate good electrode characteristics in an integrated semiconductor device. The bottom electrode 28 is connected to a "plate line" that is in turn coupled to a plurality of memory cells. The plate line is also orthogonal to the plane of FIG. 1, and therefore not shown.

The ferroelectric dielectric layer 30 preferably comprises an oxide with a perovskite crystal structure such as lead titanate zirconate, $Pb(Zr_xTi_{1-x})O_3$ (PZT) or strontium bismuth titanate, SrBiTiO, (SBT). The ferroelectric dielectric layer 30 preferably has a thickness of 1000 Å to 2000 Å, more preferably a thickness of approximately 1800 Å, although thinner and thicker layers are suitable when they demonstrate good ferroelectric qualities in an integrated semiconductor device.

The top electrode layer 32 is preferably made from electrically conducting substances such as platinum, and more preferably iridium oxide. The top electrode layer 32 preferably has a thickness of 500 Å to 2000 Å, more preferably a thickness of approximately 1500 Å, although thinner and thicker layers are suitable when they demonstrate good electrode characteristics (e.g., conductivity, suitable metal migration, heat resistance, patternability) in an integrated semiconductor device.

In a preferred embodiment, the SRO cap layer 34 lies on top of the top electrode layer 32. The SRO cap layer 34 preferably comprises an oxide of strontium and ruthenium, and more preferably comprises $Sr_{(x)}Ru_{(y)}O_3$, where y=(2-x) and x has a value from 0.9 to 1.1. The SRO cap layer 34 preferably has a thickness of 200 Å to 1500 Å, more preferably a thickness of approximately 500 Å, although thinner and thicker layers are suitable when they protect the underlying ferroelectric material in the ferroelectric dielectric layer 30 from chemical and mechanical degradation. In another embodiment, cap layer 34 is not only conducting perovskite such as SRO but also conducting layered perovskite material such as $YBaCuO_3$.

The top electrode of the capacitor 32 is coupled to the source region of the transistor 14 via a metalization layer 36. Metalization layer 36 also contacts the drain of transistor 14, forming the bit line contact. In a preferred embodiment, a passivation layer 38 may be subsequently deposited over the entire surface of the integrated circuit.

The method of the present invention comprises the steps of: Forming a layer of an amorphous oxide, that contains strontium and ruthenium, on top of a top electrode of a ferroelectric capacitor; heating the amorphous layer, at a temperature of 500° C. to 700° C., in a non-oxidizing atmosphere in order to convert the amorphous layer into a crystallized layer; and heating the crystallized layer, at a temperature of 300° C. to 500° C., in an non-reducing atmosphere, in order to convert the crystallized layer into the SRO cap layer of the present invention.

In a preferred embodiment of the method of the present invention, the layer of an amorphous oxide, that is formed on top of the top electrode of the ferroelectric capacitor, comprises $Sr_{(x)}Ru_{(y)}O_3$, where y=(2-x) and x has a value from 0.9 to 1.1. The SRO layer may be formed though a number of techniques for forming films in a layered structure integrated semiconductor device, including sol-gel processes, sputtering, and chemical vapor deposition (CVD). The amorphous SRO layer is heated at a temperature of about 650° C. in a nitrogen ($N_2$) or a noble gas atmosphere, to promote crystallization of the SRO layer. This non-oxidizing anneal can be performed at a temperature range of 500° C. to 700° C. in alternative implementations.

Subsequently, the crystallized SRO layer is heated at about 400° C. for about 5 hours, in a non-reducing or oxidizing atmosphere, to form the oxygen-annealed SRO cap layer in accordance with the present invention. The atmosphere used in this second heating preferably comprises a non-reducing gas like nitrogen or a noble gas, and more preferably comprises an oxidizing gas like oxygen ($O_2$). Because the atmosphere is non-reducing, reducing gases like hydrogen ($H_2$) should not be present. In an alternate preferred aspect of the present method, the crystallized SRO layer and the top electrode layer are etched to form the upper layers of the ferroelectric capacitor before the second heating is performed to convert the crystallized SRO layer into the final SRO cap layer.

The method of forming the SRO cap layer of the present invention may be incorporated into conventional methods for forming integrated semiconductor devices: The bottom electrode of a ferroelectric capacitor is formed on a substrate layer of the integrated semiconductor device. In a preferred embodiment, the bottom electrode is formed with a laminated structure that comprises an adhesion layer, in contact with the underlying substrate layer and a bottom electrode layer, lying on top of the adhesion layer. The lower layer preferably comprises titanium oxide formed by depositing titanium (Ti) metal on the substrate layer, and heating the metal layer in an oxygen atmosphere, at 300° C. to 700° C. The bottom electrode layer preferably comprises a conductive metal or metal oxide, and more preferably comprises platinum. The bottom electrode layer can be formed on the adhesion layer through any number of standard deposition techniques, such as DC sputtering.

Following the formation of the bottom electrode layer, the ferroelectric dielectric layer is formed on the bottom electrode. The ferroelectric dielectric layer is made from a ferroelectric material that preferably comprises an oxide with a perovskite crystal structure such as lead titanate zirconate (PZT) or strontium bismuth titanate (SBT). In a preferred aspect of the present invention the ferroelectric dielectric material is PZT that preferably may be doped with a metal selected from the group consisting of lanthanum, calcium or strontium. Preferably, RF sputtering or a sol-gel process is used to deposit the ferroelectric material on the bottom electrode. Once the ferroelectric dielectric layer is formed, heating in a non-reducing atmosphere is preferably performed to crystallize the ferroelectric material. For example, the ferroelectric material may be crystallized through a rapid thermal anneal (RTA) process.

The top electrode layer is next formed on the ferroelectric dielectric layer. The top electrode layer preferably comprises a metal or conductive oxide, more preferably comprising an oxide of platinum or iridium, and even more preferably comprising iridium oxide. The top electrode is formed on the ferroelectric dielectric layer through well-known layer deposition techniques such as DC sputtering.

After the top electrode is deposited on the ferroelectric dielectric layer, an annealing step is preferably performed that is of sufficient duration and temperature to for the grain growth of the PZT in the ferroelectric dielectric layer to be complete. Typically, this anneal is performed at about 650° C. in an atmosphere comprising a partial pressure of oxygen that is preferably 1% to 5% with the balance of the atmosphere comprising inert gases such as argon, neon, helium or xenon.

Figure 2:
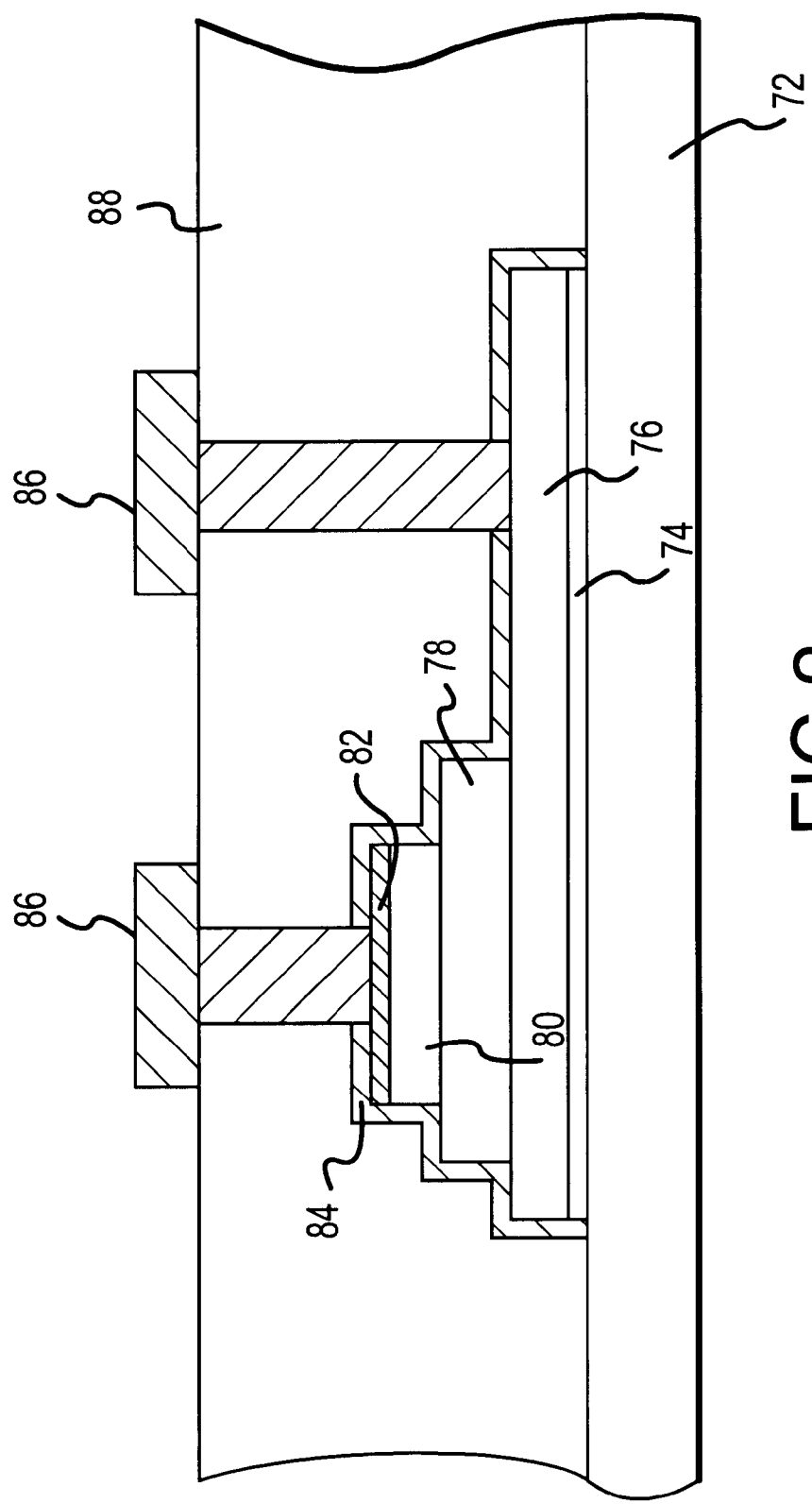
FIG. 2 is a cross section of a ferroelectric capacitor of the present invention.

After the top electrode layer has been formed and annealed, the SRO cap layer is formed on top of the top electrode layer as shown in FIG. 2, and the accompanying description above.

Following the formation of the SRO cap layer, a wide variety of integrated semiconductor fabrication processes are employed to produce the integrated semiconductor devices of the present invention. These processes include chemical etching and cleaning, ILD, CMP, and rejuvenating anneals, among others. A particular advantage of the process and structures of the present invention is that it gives the process and device designers new latitude in process variety and control that was heretofore impossible. Until now, the post-processing after deposition of the ferroelectric was very constrained by processes that would not degrade the ferroelectric material. Now, new processes that involve hydrogen exposure can be used, and process latitude is expanded making the processes easier to control.

The processes described here for the fabrication of a cap layer that protects a ferroelectric dielectric layer of a capacitor stack from mechanical and chemical degradation have used a bottom electrode preferably comprising platinum and a top electrode that preferably comprises iridium oxide. It is expected that at least some other metal, metal oxide, or even non-metallic electrically conductive substances may also produce operable top and bottom electrodes for a ferroelectric capacitor stack.

The processes described here also preferably use sputter deposition for depositing the various layers of materials that comprise the capacitor stack. It is expected that the process may function with other methods of deposition, including CVD, and solution chemistry deposition, so called "spin on" techniques, as appropriate for the various layers, and as known in the art.

EXAMPLE 1

Referring to FIG. 2, an illustrative schematic drawing of the ferroelectric capacitors used in this example is shown. The ferroelectric capacitor 70 includes a silicon dioxide ($SiO_2$) substrate layer 72, a titanium oxide adhesion layer 74, a platinum bottom electrode 76, an PZT ferroelectric dielectric layer 78, a iridium oxide top electrode 80, a SRO cap layer 82, an alumina layer 84, and aluminum alloy wiring contacts 86.

For this example, the titanium oxide adhesion layer 74 has a 200 Å thickness, the bottom electrode 76 has a 1500 Å thickness, the PZT ferroelectric dielectric layer 78 has a 1800 Å thickness, the iridium oxide top electrode 80 has a 1500 Å thickness and the SRO cap layer 82 has a 500 Å thickness. After etching the ferroelectric capacitor, an alumina layer 84 is formed over the top of the SRO cap layer and sides of the capacitor stack. Then, an interlayer of silicon dioxide 88 is formed above the alumina layer 84 and the aluminum alloy wiring contacts 86 are etched in place.

X-ray diffraction (XRD) measurements were made of the structure of SRO cap layer 82 after the layer had undergone an anneal in either a nitrogen or oxygen atmosphere. A comparison of the crystal structure of the SRO cap layer 82 as a function of the anneal temperature is shown in Table 1 below:

| Anneal Conditions | | $SrRuO_3$ (121) Structure | $SrRuO_3$ (040) Structure |
| --- | --- | --- | --- |
| No Anneal | C | No | No |
|  | B | No | No |
| Anneal at 500° C. for 1 hr in $N_2$ atmosphere | C | No | No |
|  | B | No | No |
| Anneal at 650° C. for 1 hr in $N_2$ atmosphere | C | 450 | No |
|  | B | 460 | No |
| Anneal at 650° C. for 1 hr in $O_2$ atmosphere | C | 620 | 240 |
|  | B | 600 | 213 |

The results shown in Table 1 indicate that crystallization of the SRO cap layer does not occur for anneal temperature of 500° C. or lower in a non-reducing atmosphere. In contrast, at a 650° C. anneal temperature, to convert amorphous SRO into crystallized perovskite, the (121) and/or (040) $SrRuO_3$ crystal phases are present in the SRO cap layer 82.

Figure 3:
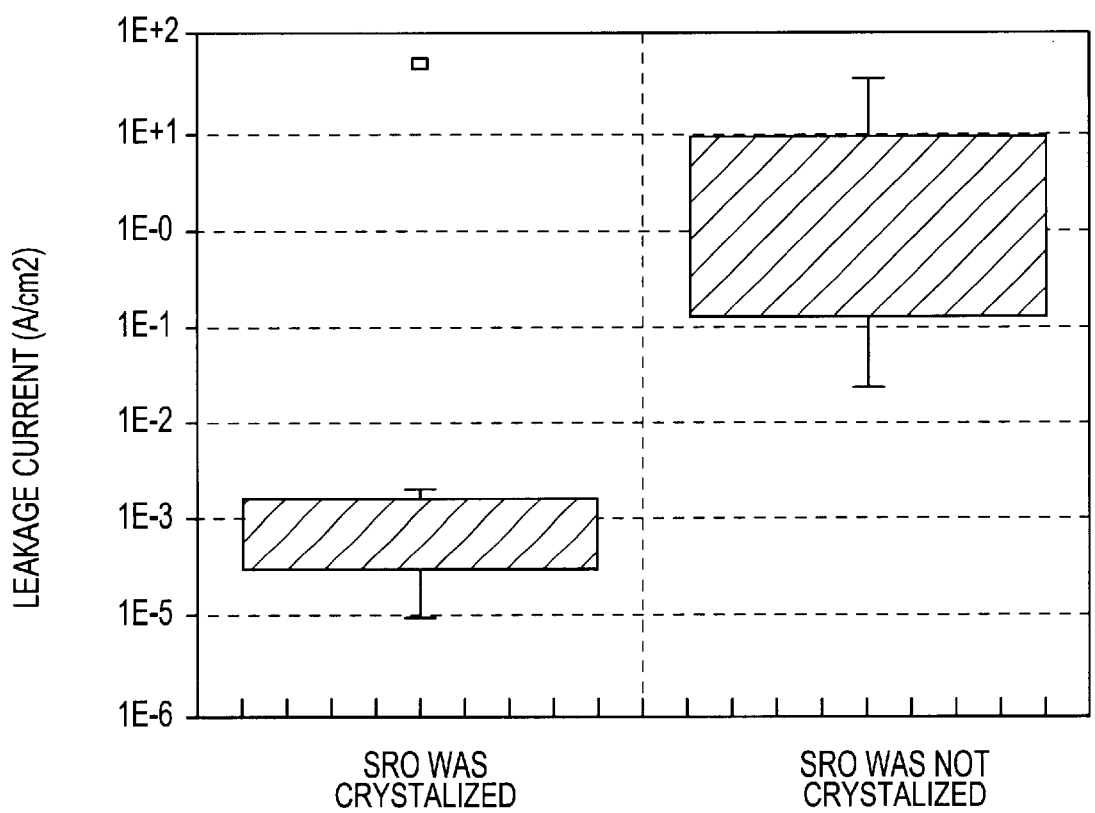
FIG. 3 is a graph comparing leakage current for SRO cap layers that contain crystallized and non-crystallized $SrRuO_3$.

Referring now to FIG. 3, a comparison of leakage current for crystallized and non-crystallized SRO cap layers is shown. FIG. 3 shows that the leakage current is much higher when the $SrRuO_3$ in the SRO cap layer 82 is not crystallized, than when the SRO cap layer 82 is crystallized. High current leakage can degrade the performance of ferroelectric capacitors.

EXAMPLE 2

In this example, polarization switching charge ($Q_{sw}$) is compared for ferroelectric capacitors with and without the SRO cap layer 82 and the alumina layer 84. The capacitors all have the essentially the same structure, as illustrated by FIG. 2, except where the SRO cap layer 82 and alumina layer 84 are noted as being absent.

Figure 4:
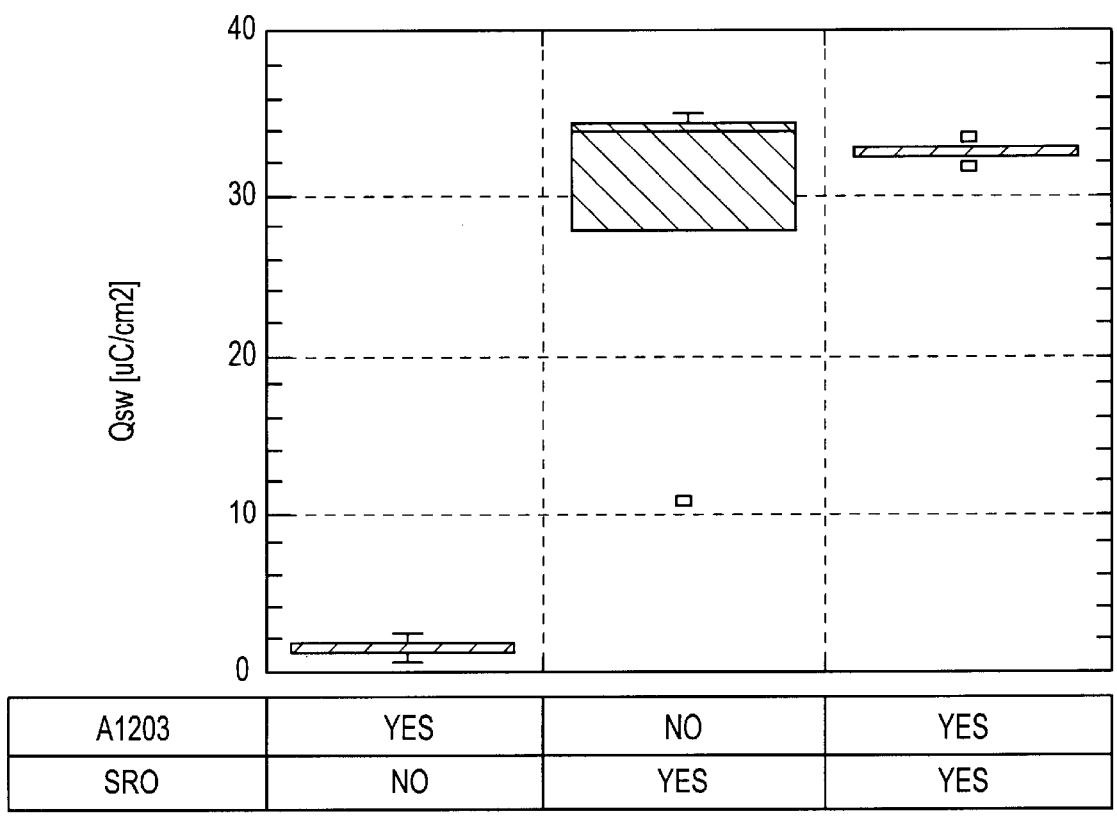
FIG. 4 is a graph comparing the polarization switching charge ($Q_{sw}$) for three different ferroelectric capacitors.

Referring now to FIG. 4, the $Q_{sw}$ of three different ferroelectric capacitors were measured following the etching and formation of the aluminum alloy wiring contacts 86. A $Q_{sw}$ of about 33 $\mu C/cm^2$ was measured in all three capacitors prior to processing the aluminum alloy contacts 86. The first capacitor has the structure illustrated in FIG. 2, except that the SRO cap layer 82 is absent. The second capacitor has an SRO cap layer 82, but no alumina layer 84, and the third capacitor had both the SRO cap layer 82 and the alumina layer 84 present. As shown in FIG. 4, the PZT in the ferroelectric dielectric layer 78 was severely degraded during the processing of the aluminum alloy contacts 86, resulting in a $Q_{sw}$ near 0 $\mu C/cm^2$. In contrast, the second and third capacitors have the SRO cap layer 82 present, and there is significantly less degradation of the PZT in the ferroelectirc dielectric layer 78.

Figure 5:
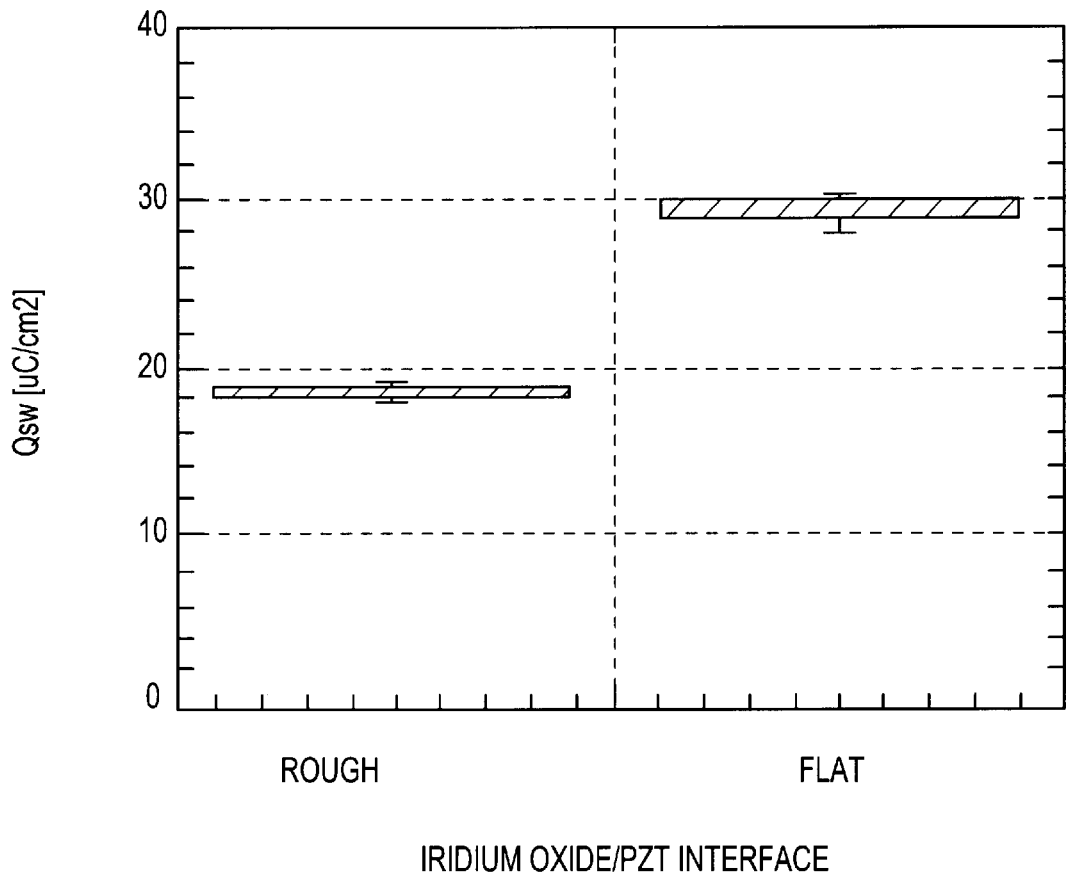
FIG. 5 is a graph comparing the polarization switching charge ($Q_{sw}$) with the surface roughness of the interface between the top electrode and the ferroelectric dielectric layer of a ferroelectric capacitor.

Referring now to FIG. 5, two ferroelectric capacitors, as shown in FIG. 2, that had different surface roughness at the interface of the iridium oxide top electrode 80 and the PZT ferroelectric dielectric layer 78. As FIG. 5 illustrates, a rougher interface between these two layers yields a reduced $Q_{sw}$ value for the capacitor. The present invention may be used to a PZT layer in place of the alumina layer 84.

EXAMPLE 3

In this example, the ability of the SRO cap layer to protect against hydrogen degradation of PZT in the ferroelectric dielectric layer of a ferroelectric capacitor is demonstrated. The experiment started by placing ferroelectric capacitors with SRO cap layers in a hydrogen atmosphere at elevated temperature. The hydrogen degradation of the PZT was measured by measuring the decrease in the polarization switching charge ($Q_{sw}$) of the capacitor. A comparison of SRO cap layers formed under varying process conditions demonstrate that the layer forms the strongest barrier to hydrogen when heated in a non-reducing atmosphere at 300° C. to 500° C.

The ferroelectric capacitors used in this example comprise the following layers from the bottom up: a substrate layer, an adhesion layer, a bottom electrode, a ferroelectric dielectric layer, a top electrode layer, and a SRO cap layer. The adhesion layer is a 500 Å layer of titanium oxide ($TiO_x$), the bottom electrode is a 1500 Å layer of platinum, the ferroelectric dielectric layer is a 1800 Å layer of PZT, the top electrode is a 1500 Å layer of iridium oxide ($IrO_x$), and a SRO cap layer having a thickness of 500 Å.

Figure 6:
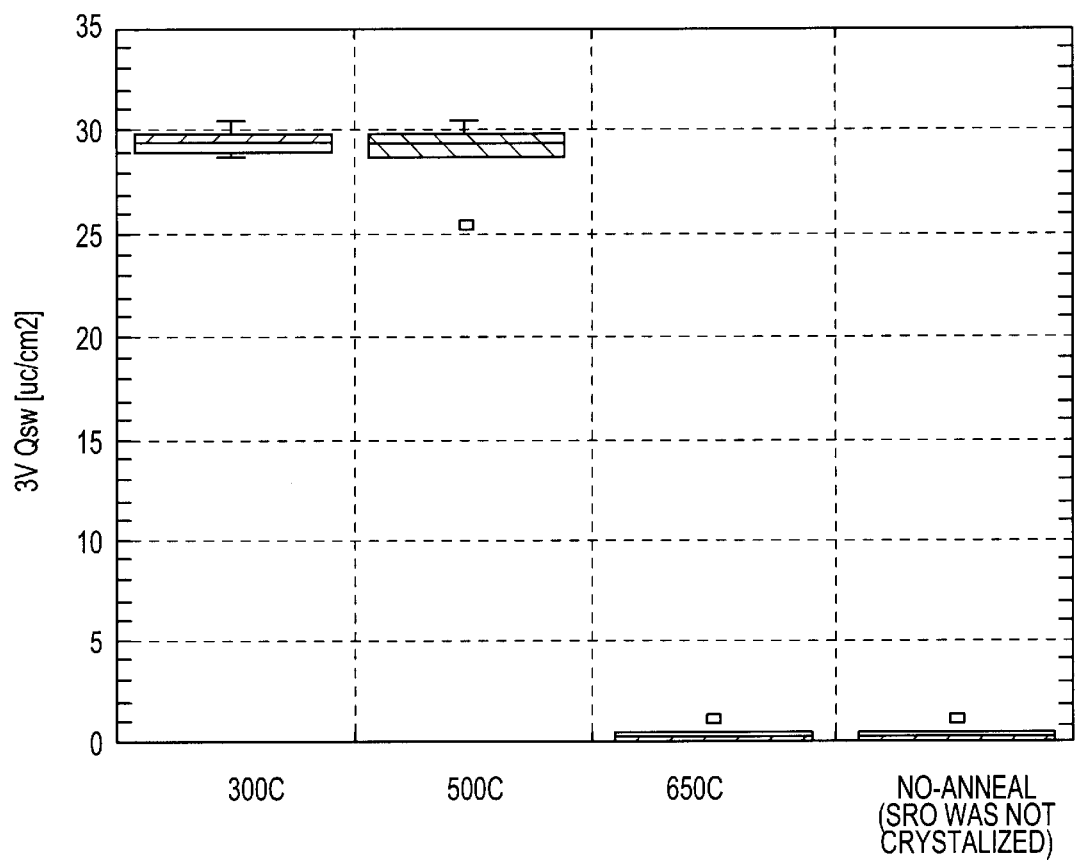
FIG. 6 is a graph comparing the polarization switching charge ($Q_{sw}$) as a function of the anneal temperature of the SRO cap layer.
Figure 7:
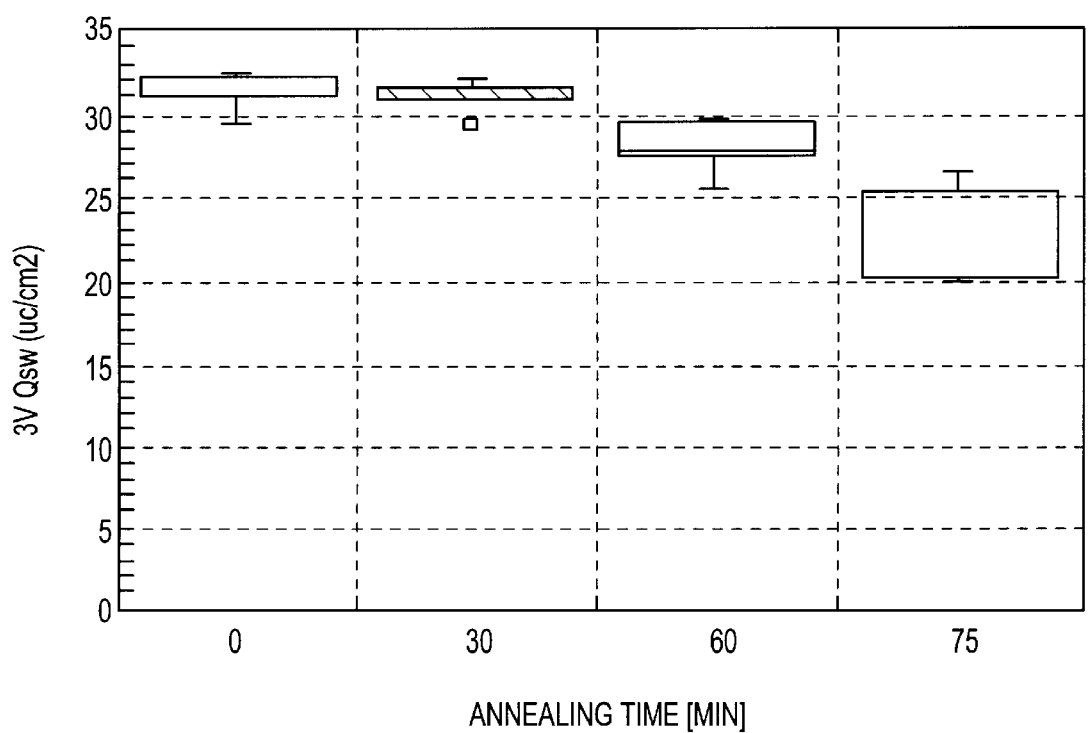
FIG. 7 is a graph of the polarization switching charge ($Q_{sw}$) as a function of the time a ferroelectric capacitor spends in a hydrogen environment.

FIG. 6 shows the polarization switching charge ($Q_{sw}$) following heating the ferroelectric capacitor sample at 150° C. in an atmosphere comprising 3% hydrogen gas ($H_2$). After a 15 minute exposure to this hydrogen environment, the ferroelectric capacitor that had an SRO cap layer that was heated in oxygen at 300° C. to 500° C. maintained a $Q_{sw}$ value as high as 30 $\mu C/cm^2$. In contrast, the ferroelectric capacitor that had an SRO cap layer heated at 650° C., instead of the 300° C. to 500° C. range, had a $Q_{sw}$ of almost zero for the same exposure to the hydrogen environment. In addition to this, the ferroelectric capacitor that had an SRO cap layer with no anneal, which means that the SRO cap layer was not crystallized but was amorphous, had a $Q_{sw}$ of almost zero for the same exposure to the hydrogen environment FIG. 7 further demonstrates that forming the SRO cap layer through heating the crystallized SRO in a non-reducing atmosphere at temperature of 300° C. to 500° C. enhances its effectiveness as a barrier to hydrogen. FIG. 7 shows that a ferroelectric capacitor having an SRO cap layer that was heated in oxygen at 300° C. to 500° C., maintained as $Q_{sw}$ value as high as 20 $\mu C/cm^2$, even after being exposed to a hydrogen environment for 75 minutes. Meanwhile, ferroelectric capacitors that had SRO cap layers that were heated at 650° C., or not heated at all, had $Q_{sw}$ values of zero after just 15 minutes of exposure to the same hydrogen environment.

Figure 8:
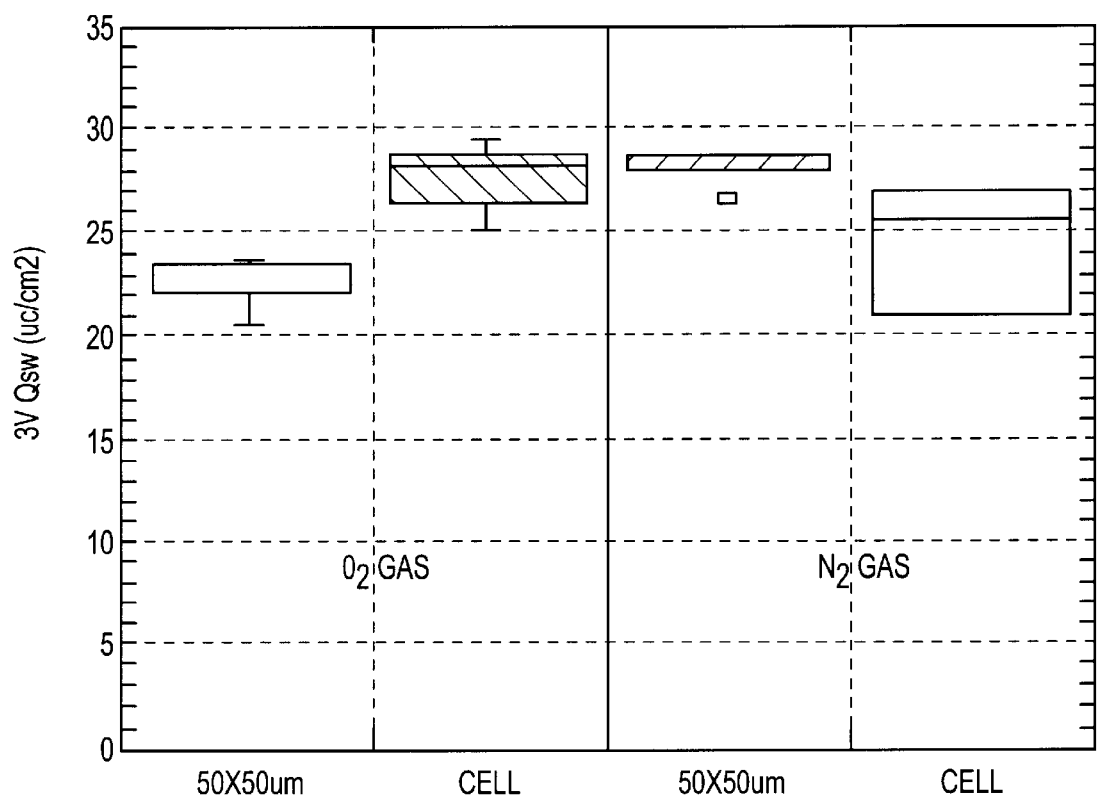
FIG. 8 is a graph of the polarization switching charge ($Q_{sw}$) for various SRO cap layer formation techniques.

In FIG. 8, the polarization switching charge ($Q_{sw}$) is measured for a ferroelectric capacitor that has a SRO cap layer formed by annealing at 400° C. for 10 hours. The experiment included a comparison of SRO cap layers annealed in an oxygen ($O_2$) atmosphere versus a nitrogen ($N_2$) atmosphere, as well as a comparison of ferroelectric capacitors having 50×50 $\mu m$ structures versus those having a cell capacitor structure. Following the 400° C. anneal of the SRO cap layer, the ferroelectric capacitors underwent an aluminum layer 1 wiring process, and then the $Q_{sw}$ was measured to assess the degradation of the PZT caused by the wiring process.

The $Q_{sw}$ data show that all SRO cap layers annealed at 400° C. protected the underlying PZT in the ferroelectric dielectric layer from degradation during the aluminum layer 1 wiring process. The results indicate that the SRO cap layers protect the underlying PZT when annealed in either the oxygen or nitrogen atmosphere. Thus, the 300° C. to 500° C. annealing step in the SRO cap layer formation method of the present invention may be performed in an non-reducing atmosphere that includes both oxidizing atmospheres like oxygen, and inert gas atmospheres like nitrogen and the noble gases (e.g., helium, argon, krypton, and xenon).

While the invention has been particularly shown and described above with reference to a preferred embodiment, it should be understood by those skilled in the art that various other changes in the form and details may be made without departing from the sprit and scope of the invention.

We claim:

1. An integrated semiconductor device comprising:
   a semiconductor substrate;
   semiconductor devices formed in the semiconductor substrate;
   a ferroelectric capacitor formed above the semiconductor substrate, wherein the ferroelectric capacitor comprises a bottom electrode, a ferroelectric dielectric layer formed above the bottom electrode and a top electrode formed above the ferroelectric dielectric layer; and
   a crystallized cap layer comprising strontium, ruthenium and oxygen formed above the top electrode, wherein said crystallized cap layer is formed by heating an amorphous layer in a non-oxidizing atmosphere.

2. The ferroelectric capacitor of claim 1, wherein said top electrode further comprises an Ir oxide layer which is in contact with the ferroelectric dielectric layer.

3. The ferroelectric capacitor of claim 1, further comprising:

an insulating layer formed above the ferroelectric capacitor, wherein said insulating layer comprises an insulating metal oxide selected from the group consisting of weakly conducting PZT and aluminum oxide.

4. The ferroelectric capacitor of claim 1, wherein said ferroelectric dielectric layer comprises PZT.

5. The ferroelectric capacitor of claim 1, wherein said bottom electrode comprises platinum.

6. An integrated semiconductor device comprising:

a semiconductor substrate;

semiconductor devices formed in the semiconductor substrate;

a ferroelectric capacitor formed above the semiconductor substrate, wherein the ferroelectric capacitor comprises a bottom electrode, a ferroelectric dielectric layer formed above the bottom electrode and a top electrode comprising an iridium oxide formed above the ferroelectric dielectric layer;

a crystallized cap layer comprising strontium, ruthenium and oxygen formed above the top electrode, wherein said crystallized cap layer is formed by heating an amorphous layer in a non-oxidizing atmosphere; and an insulating layer formed above the ferroelectric capacitor, wherein said insulating layer comprises an insulating metal oxide selected from the group consisting of weakly conducting PZT and aluminum oxide.

7. The ferroelectric capacitor of claim 6, wherein said ferroelectric dielectric layer comprises PZT.

8. The ferroelectric capacitor of claim 6, wherein said bottom electrode comprises platinum.

* * * * *